(12) United States Patent
Xiong et al.

(10) Patent No.: US 11,282,632 B2
(45) Date of Patent: Mar. 22, 2022

(54) POWER MODULE

(71) Applicant: Delta Electronics, Inc., Taoyuan (TW)

(72) Inventors: Yahong Xiong, Taoyuan (TW); Da Jin, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 180 days.

(21) Appl. No.: 16/591,436

(22) Filed: Oct. 2, 2019

(65) Prior Publication Data

US 2020/0113058 A1 Apr. 9, 2020

Related U.S. Application Data

(60) Provisional application No. 62/770,432, filed on Nov. 21, 2018, provisional application No. 62/743,251, filed on Oct. 9, 2018.

(30) Foreign Application Priority Data

Dec. 12, 2018 (CN) .......................... 201811519354.1
Sep. 23, 2019 (CN) .......................... 201910900102.1

(51) Int. Cl.
*H05K 1/18* (2006.01)
*H01F 27/28* (2006.01)
(Continued)

(52) U.S. Cl.
CPC ......... *H01F 27/2804* (2013.01); *G05F 1/575* (2013.01); *G06F 1/183* (2013.01);
(Continued)

(58) Field of Classification Search
CPC ... H05K 1/11; H05K 1/14; H05K 1/16; H05K 1/18; H05K 1/181–187; H05K 7/10;
(Continued)

(56) References Cited

U.S. PATENT DOCUMENTS 5,229,916 A 7/1993 Frankeny et al.
5,515,604 A 5/1996 Horine et al.
(Continued)

FOREIGN PATENT DOCUMENTS

CN 102301435 A 12/2011
CN 202406391 U 8/2012
(Continued)

*Primary Examiner* — Tuan T Dinh
(74) *Attorney, Agent, or Firm* — Kirton McConkie; Evan R. Witt

(57) ABSTRACT

A power module comprises a first circuit board assembly, a second circuit board assembly and a magnetic assembly. The first circuit board assembly comprises a first printed circuit board and at least one power circuit. The second circuit board assembly comprises a second printed circuit board and at least one output capacitor. The magnetic assembly is located between the first circuit board assembly and the second circuit board assembly and comprises a magnetic core module and at least one first electrical conductor. The magnetic core module comprises at least one hole. The at least one first electrical conductor passes through the corresponding hole of the magnetic core module to define at least one output inductor. Each of the at least one output inductor is electrically connected with the corresponding power circuit and the at least one output capacitor so that the power module forms at least one phase converter.

20 Claims, 12 Drawing Sheets

(51) Int. Cl.

| | |
|---|---|
| *G05F 1/575* | (2006.01) |
| *H01F 27/02* | (2006.01) |
| *H01F 27/29* | (2006.01) |
| *G06F 1/18* | (2006.01) |
| *H01F 17/04* | (2006.01) |
| *H05K 1/02* | (2006.01) |
| *H05K 1/16* | (2006.01) |
| *H05K 7/14* | (2006.01) |
| *H05K 7/20* | (2006.01) |
| *H01L 25/16* | (2006.01) |
| *H01R 12/52* | (2011.01) |
| *H01R 12/58* | (2011.01) |
| *H02M 3/158* | (2006.01) |
| *H05K 1/11* | (2006.01) |

(52) U.S. Cl.
CPC ............ *H01F 17/04* (2013.01); *H01F 27/02* (2013.01); *H01F 27/292* (2013.01); *H01L 25/16* (2013.01); *H01R 12/52* (2013.01); *H01R 12/58* (2013.01); *H02M 3/1584* (2013.01); *H05K 1/0203* (2013.01); *H05K 1/111* (2013.01); *H05K 1/165* (2013.01); *H05K 1/181* (2013.01); *H05K 1/186* (2013.01); *H05K 7/1427* (2013.01); *H05K 7/2089* (2013.01); *H05K 2201/1003* (2013.01); *H05K 2201/10015* (2013.01); *H05K 2201/10166* (2013.01); *H05K 2201/10522* (2013.01); *H05K 2201/10636* (2013.01)

(58) Field of Classification Search
CPC .... H01F 27/24; H01F 27/28–29; H01F 17/04; H01F 17/43
USPC ............ 361/767–790, 792, 803; 336/65, 83, 336/192–200, 220–223, 232
See application file for complete search history.

(56) References Cited

U.S. PATENT DOCUMENTS

| | | | |
|---|---|---|---|
| 6,420,953 B1 * | 7/2002 | Dadafshar | H01F 27/2804 336/200 |
| 8,498,124 B1 | 7/2013 | Folker et al. | |
| 9,263,177 B1 | 2/2016 | Ikriannikov et al. | |
| 9,729,059 B1 | 8/2017 | Parto | |
| 2004/0113741 A1 | 6/2004 | Li et al. | |
| 2004/0239463 A1 * | 12/2004 | Poniatowski | H01F 27/38 336/10 |
| 2005/0083665 A1 * | 4/2005 | Nakashima | H05K 1/144 361/767 |
| 2005/0168961 A1 | 8/2005 | Ono et al. | |
| 2006/0038549 A1 | 2/2006 | Mehrotra et al. | |
| 2009/0201624 A1 | 8/2009 | Hattori et al. | |
| 2009/0231885 A1 | 9/2009 | Won et al. | |
| 2010/0259882 A1 | 10/2010 | Song | |
| 2010/0321140 A1 | 12/2010 | Tanaka et al. | |
| 2011/0148560 A1 | 6/2011 | Ikriannikov | |
| 2011/0234196 A1 | 9/2011 | Chiba | |
| 2011/0317387 A1 | 12/2011 | Pan et al. | |
| 2013/0049730 A1 | 2/2013 | Kato | |
| 2015/0282370 A1 * | 10/2015 | Yang | H01F 5/00 361/736 |
| 2016/0086723 A1 | 3/2016 | Su et al. | |
| 2016/0093432 A1 * | 3/2016 | Chung | H02M 3/33569 363/21.04 |
| 2018/0122562 A1 | 5/2018 | Ji et al. | |
| 2018/0323702 A1 | 11/2018 | Zhou et al. | |
| 2019/0354154 A1 | 11/2019 | Yates et al. | |

FOREIGN PATENT DOCUMENTS

| | | |
|---|---|---|
| CN | 103096646 A | 5/2013 |
| CN | 103298258 A | 9/2013 |
| CN | 203368934 U | 12/2013 |
| CN | 104603941 A | 5/2015 |
| CN | 105425918 A | 3/2016 |
| CN | 105487619 A | 4/2016 |
| CN | 206877816 U | 1/2018 |
| CN | 206961615 U | 2/2018 |
| CN | 108022917 A | 5/2018 |
| CN | 108288919 A | 7/2018 |
| CN | 108447841 A | 8/2018 |
| CN | 108811320 A | 11/2018 |
| CN | 108880283 A | 11/2018 |
| WO | 2010053821 A2 | 5/2010 |

* cited by examiner

POWER MODULE

CROSS-REFERENCE TO RELATED APPLICATION

This application claims the benefit of U.S. Provisional Application Ser. No. 62/743,251 filed on Oct. 9, 2018, claims the benefit of U.S. Provisional Application Ser. No. 62/770,432 filed on Nov. 21, 2018, claims priority to China Patent Application No. 201811519354.1 filed on Dec. 12, 2018, and claims priority to China Patent Application No. 201910900102.1 filed on Sep. 23, 2019, the entire contents of which are incorporated herein by reference for all purposes.

FIELD OF THE INVENTION

The present disclosure relates to a power module, and more particularly to a power module capable of reducing the power loss and enhancing the heat dissipating efficiency.

BACKGROUND OF THE INVENTION

FIG. 1A is a schematic side view illustrating the configuration of a conventional electronic device. FIG. 1B is a schematic exploded view illustrating the structure of a power module of the electronic device as shown in FIG. 1A. As shown in FIGS. 1A and 1B, the conventional electronic device 6 includes a central processing unit (CPU) 7, a power module 8 and a system board 9. The power module 8 is served as a Voltage Regulator Module (VRM) and converts an input power into a regulated power to be supplied to the central processing unit 7. The power module 8 and the central processing unit 7 are disposed on a same surface of the system board 9. The power module 8 includes a magnetic core 91, a printed circuit board (PCB) 92 and a plurality of copper bars 93, 94. The copper bars 93, 94 form the output inductors with the magnetic core 91. There is a gap 95 formed between the printed circuit board 92 and the magnetic core 91. The power elements can be disposed on the printed circuit board 92 and located in the gap 95. In this conventional electronic device 6, the thermal resistance between the thermal sources, for example the copper bars 93, 94 or the power elements, and the surface of the printed circuit board 92 of the power module 8 is small. The heat generated from the power module 8 can be conducted to the system board 9.

Because of the increasing output current of the voltage regulator module, the output voltage drop is becoming larger. Now, in order to increase the performance of dynamic of the voltage regulator module and enhance the main frequency of the central processing unit, there may be a better solution that the central processing unit and the voltage regulator module can be disposed on the opposite surfaces of the system board to shorten the path between the output of the voltage regulator module and the central processing unit. However, if the central processing unit and the voltage regulator module are disposed on the opposite surfaces of the system board, the power module can't meet the specification of thermal because the heat from the power module fails to be conducted to the system board due to the other thermal source, for example the central processing unit. The power module has a first surface in contact with a case of the electronic device and a second surface fixed on the system board. The thermal resistance between the thermal sources of the power module and the first surface of the power module is larger than the thermal resistance between the thermal sources of the power module and the second surface of the power module. Therefore, the effect of the thermal conduction between the power module and the case of the electronic device is not satisfied.

SUMMARY OF THE INVENTION

An object of the present disclosure provides a power module. The power module can reduce the power loss of output inductors. Besides, it is benefit for the power module to conduct the heat to a case of the electronic device. Moreover, suitable inductance of the output inductors of the power module can be obtained.

In accordance with an aspect of the present disclosure, a power module is provided. The power module comprises a first circuit board assembly, a second circuit board assembly and a magnetic assembly. The first circuit board assembly comprises a first printed circuit board and at least one power circuit. The second circuit board assembly comprises a second printed circuit board and at least one output capacitor. The magnetic assembly is located between the first circuit board assembly and the second circuit board assembly and comprises a magnetic core module and at least one first electrical conductor. The magnetic core module comprises at least one hole. The at least one first electrical conductor passes through the corresponding hole of the magnetic core module to define at least one output inductor. Each of the at least one output inductor is electrically connected with the corresponding power circuit and the at least one output capacitor so that the power module forms at least one phase converter.

From the above descriptions, the present disclosure provides a power module. Since the power module of the present disclosure employs the first electrical conductors as the windings of the output inductors, the power loss of the output inductors can be reduced. In addition, since the first electrical conductors have good thermal conductivity and shorter length, the thermal resistance between the thermal sources and the case of the electronic device is reduced by the first electrical conductors. Therefore, it is benefit to the power module to conduct the heat to the case of the electronic device. At the same time, suitable inductance can be obtained according to the length of the first electrical conductors and the cross-sectional area of the magnetic core. Moreover, since some of the pins of the signal PIN combination are plugged into the half-holes of the second surface of the first printed circuit board or are directly soldered on the second surface of the first printed circuit board without passing through the through-holes of the first printed circuit board, it can save the area of the first surface of the first printed circuit board. Therefore, additional electronic elements can be settled on this saved area of the first surface of the first printed circuit board so as to increase the power density of the power module.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
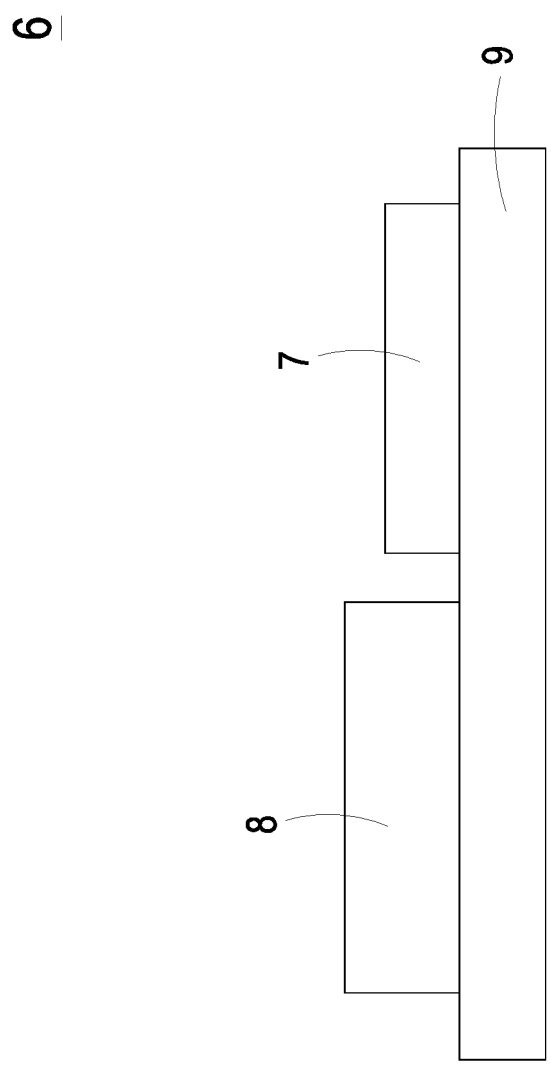
FIG. 1A is a schematic side view illustrating the configuration of a conventional electronic device.
Figure 1B:
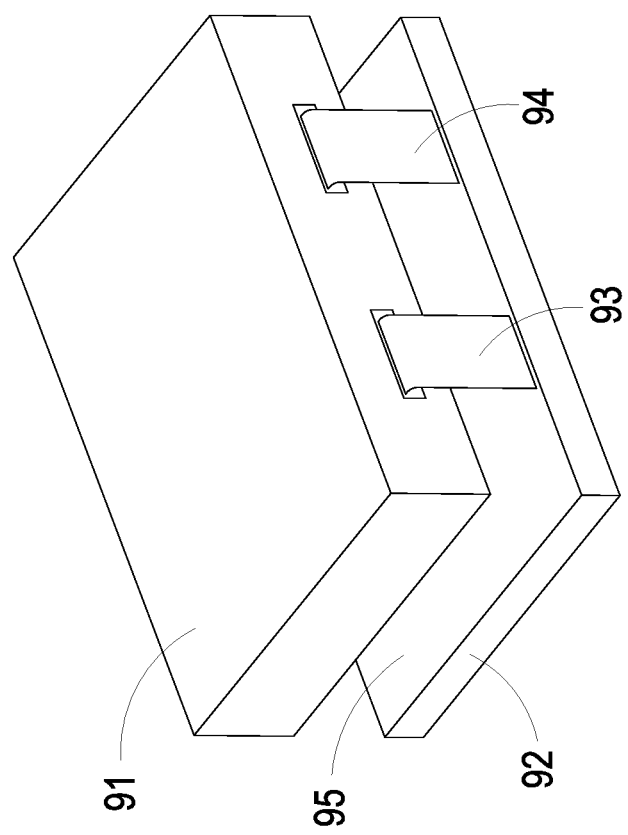
FIG. 1B is a schematic exploded view illustrating the structure of a power module of the electronic device as shown in FIG. 1A.
Figure 2A:
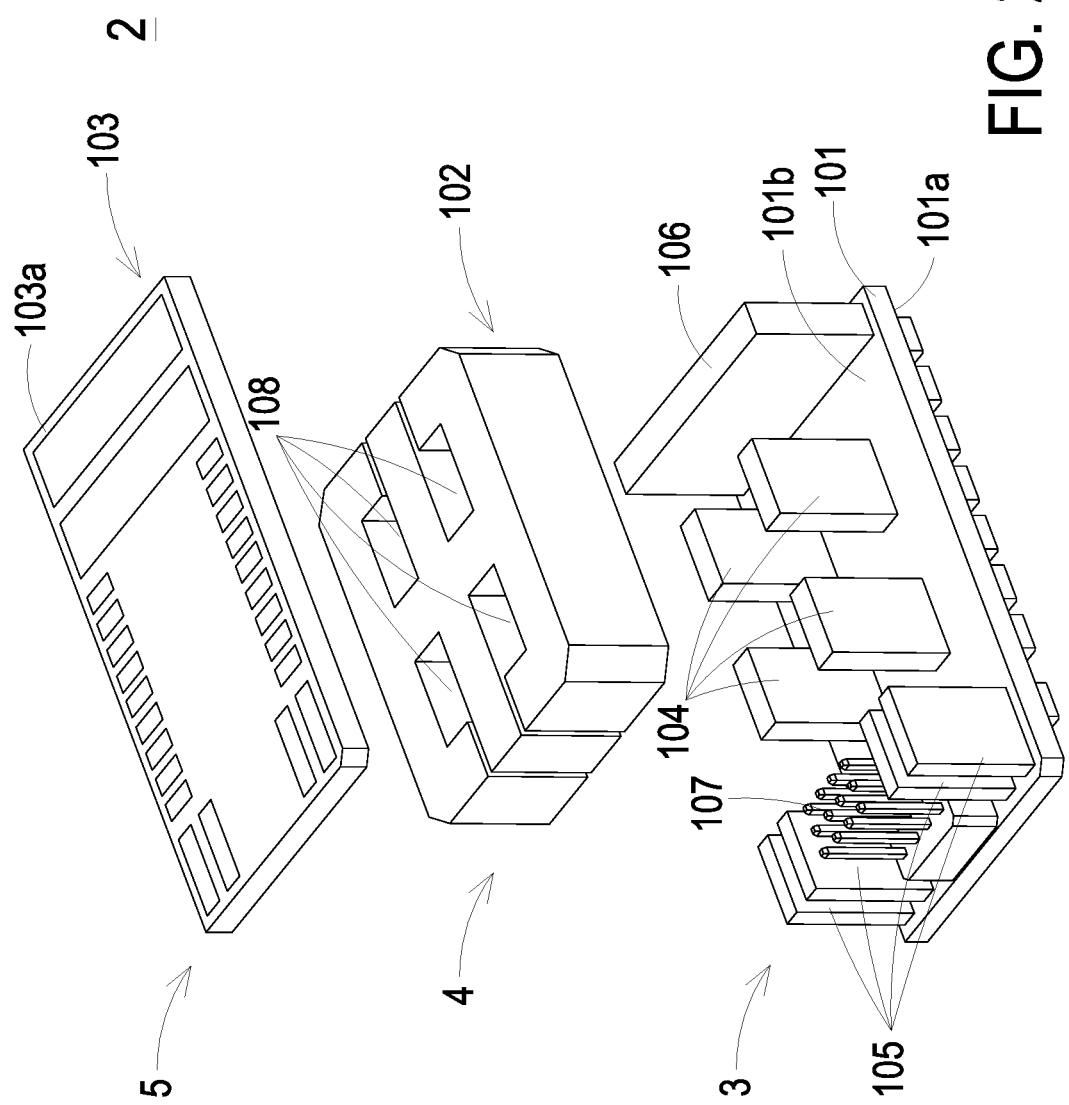
FIG. 2A is a schematic exploded view illustrating a power module according to an embodiment of the present invention.
Figure 2B:
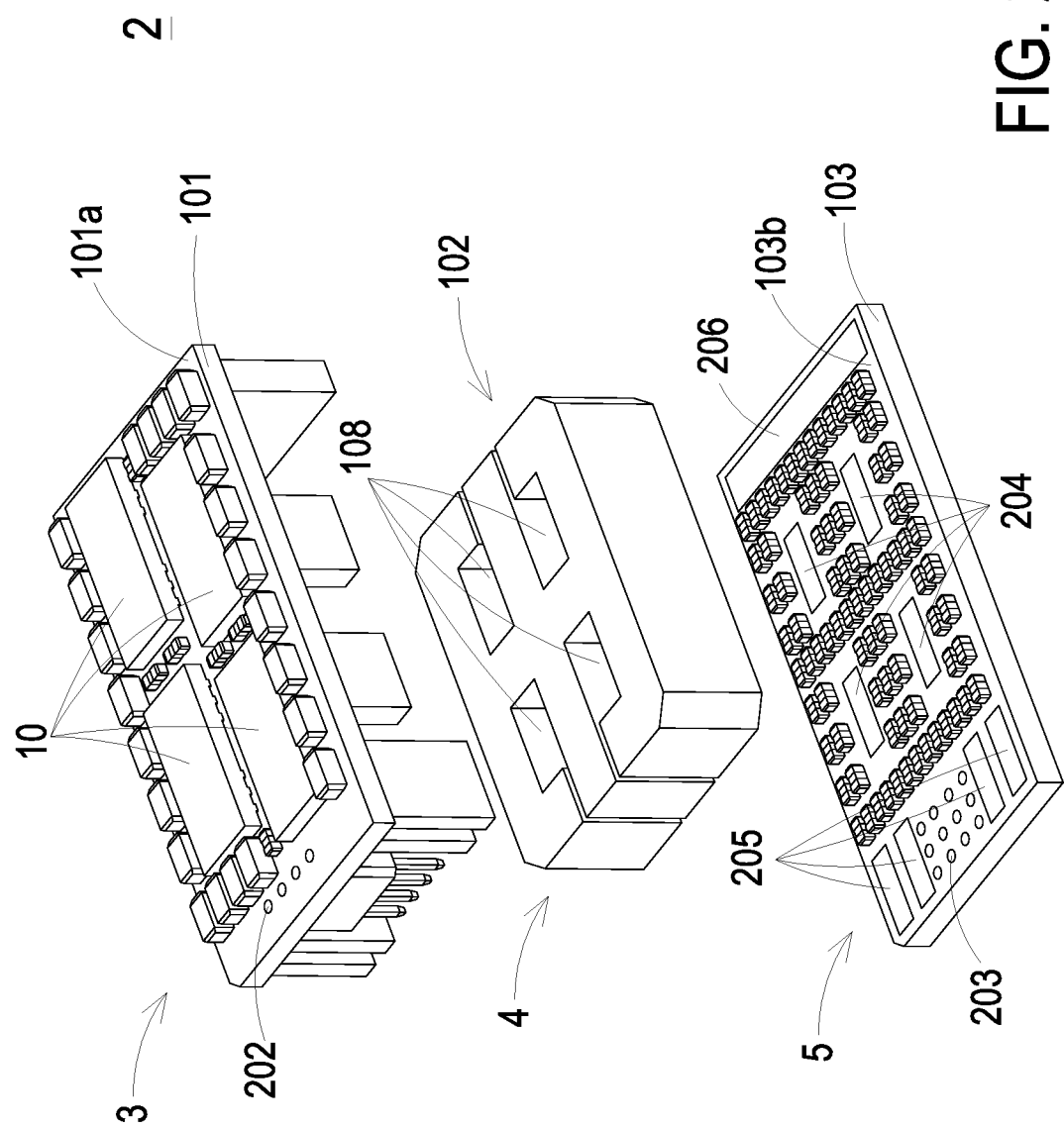
FIG. 2B is a schematic exploded view illustrating the power module of FIG. 2A and taken along opposite viewpoint.
Figure 3:
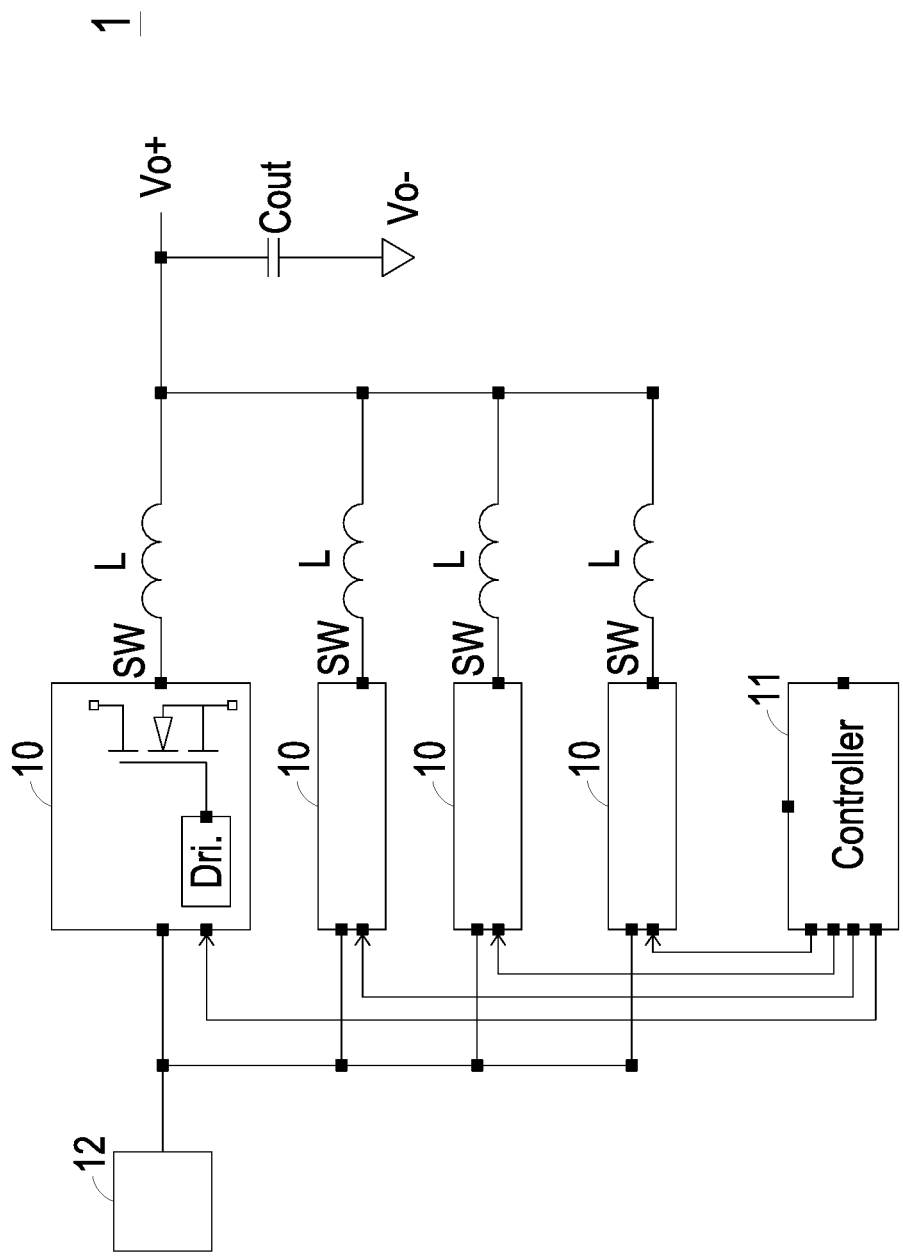
FIG. 3 is a schematic circuit diagram illustrating an equivalent circuit of a voltage regulator module formed by the power module of FIG. 2A.

FIG. 2A is a schematic exploded view illustrating a power module according to an embodiment of the present invention. FIG. 2B is a schematic exploded view illustrating the power module of FIG. 2A and taken along opposite viewpoint. FIG. 3 is a schematic circuit diagram illustrating an equivalent circuit of a voltage regulator module formed by the power module of FIG. 2A. The power module 2 can form a voltage regulator module (VRM) 1 which can be applied into an electronic device. The voltage regulator module 1 can be for example but not limited to 4-phase buck converter. The voltage regulator module 1 comprises a plurality of power circuits 10, a plurality of output inductors L, a controller 11 and at least one output capacitor Cout. Each of the power circuits 10 is electrically connected with a terminal SW of a corresponding output inductor L to form a phase buck circuit. Therefore, the voltage regulator module 1 comprises four phase buck circuits, which are connected in parallel and connected between a power source 12 and a first terminal of the output capacitor Cout. Besides, each of the power circuits 10 comprises at least one switch element and a driver which is used to drive the at least one switch element. Moreover, the output inductors L can be independent with each other. In other embodiment, the output inductors L can also be coupled together to reduce the ripple of the output current of the voltage regulator module 1. The controller 11 senses the output voltage and the output current of every phase buck circuit to generate pulse width modulation signals to control every phase buck circuit. The first terminal of the output capacitor Cout forms a positive output terminal (Vo+) of the voltage regulator module 1, and a second terminal of the output capacitor Cout is connected with a ground and forms a negative output terminal (Vo−) of the voltage regulator module 1.

Figure 4:
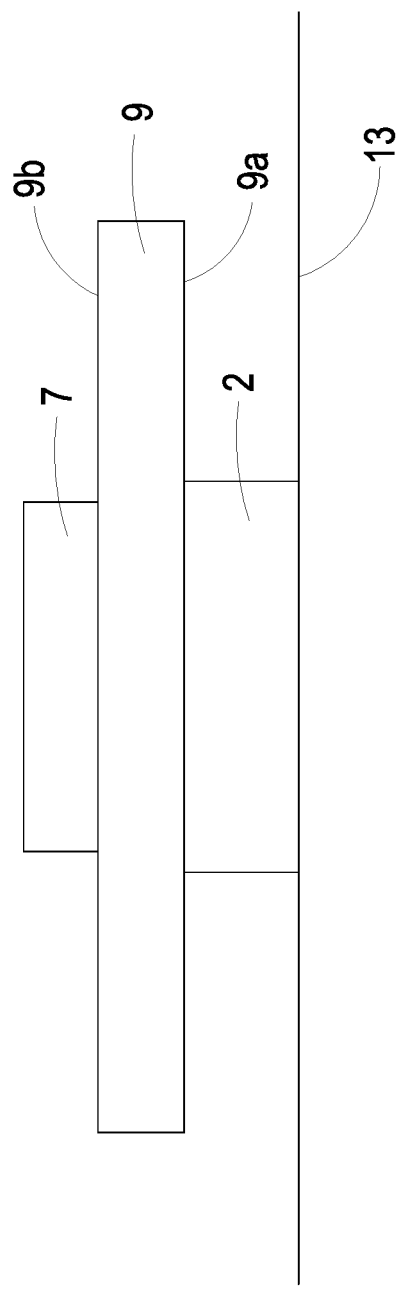
FIG. 4 is a schematic assembled view illustrating the power module of FIG. 2A assembled with a central processing unit and a system board.

As shown in FIGS. 2A and 2B, the power module 2 comprises a first circuit board assembly 3 and a magnetic assembly 4. The first circuit board assembly 3 comprises a first printed circuit board 101 and at least one power circuit 10. The magnetic assembly 4 comprises a magnetic core module 102 and a plurality of first electrical conductors 104. The first printed circuit board 101 has a first surface 101a and a second surface 101b. Besides, the power circuits 10 shown in FIG. 3 are settled on the first surface 101a of the first printed circuit board 101. The first printed circuit board 101 with the power circuits 10 may be in contact with a case 13 (as shown in FIG. 4) of the electronic device so that the heat generated from the power module 2 can be conducted to the case 13 of the electronic device by the first printed circuit board 101. The operations of the power circuits 10 cause the main portion of heat of the power module 2, and the power circuits 10 are fitted together with the case 13 of the electronic device so that the heat from the power circuits 10 can be conducted to the case 13 directly. In this embodiment, the number of the first electrical conductors 104 corresponds to the number of the output inductors L shown in FIG. 3. Preferably but not exclusively, the power module 2 comprises four first electrical conductors 104. A first terminal of each first electrical conductor 104 which is connected with the corresponding power circuit 10 is soldered on the second surface 101b of the first printed circuit board 101. The magnetic core module 102 comprises a plurality of holes 108. In this embodiment, the number of the holes 108 corresponds to the number of the first electrical conductors 104. Preferably but not exclusively, the magnetic core module 102 comprises four holes 108, and each of the holes 108 is corresponding in position to the corresponding first electrical conductor 104. The four first electrical conductors 104 pass through the four holes 108 of the magnetic core module 102 respectively so that the four output inductors L of the voltage regulator module 1 can be formed by the combination of the magnetic core module 102 and the four first electrical conductors 104.

FIG. 4 is a schematic assembled view illustrating the power module of FIG. 2A assembled with a central processing unit and a system board. When the power module 2 is applied into the electronic device to assembly with a central processing unit 7 and a system board 9 of the electronic device, the power module 2 and the central processing unit 7 are disposed on the opposite surfaces of the system board 9. The system board 9 has a first surface 9a and a second surface 9b. The power module 2 disposed on the first surface 9a of the system board 9 is corresponding in position to the central processing unit 7 disposed on the second surface 9b of the system board 9.

From the above descriptions, since the power module 2 of the present disclosure employs the first electrical conductors 104 as the windings of the output inductors L, the power module 2 can reduce the power loss of the output inductors L. In addition, since the first electrical conductors 104 comprise good thermal conductivity and shorter length, the thermal resistance between the output inductors L and the first printed circuit board 101 is reduced by the first electrical conductors 104. Therefore, it is benefit to the power module 2 to conduct the heat to the case 13 of the electronic device. At the same time, suitable inductance can be obtained according to the length of the first electrical conductors 104 and the cross-sectional area of the magnetic core module 102.

In some embodiments, the power module 2 comprises a plurality of second electrical conductors 105 soldered on one edge of the second surface 101b of the first printed circuit board 101. One or more of the plurality of second electrical conductors 105 form a positive input terminal of the voltage regulator module 1, and the other of the plurality of second electrical conductors 105 form a negative input terminal of the voltage regulator module 1. Since the power module 2 of the present disclosure employs the second electrical conductors 105 as the input terminal of the voltage regulator module 1, the power module 2 can reduce the equivalent series resistance ESR and the equivalent series inductance ESL so that the performance of the voltage regulator module 1 is enhanced. In some embodiments, the power module 2 comprises a third electrical conductor 106 soldered on the other edge of the second surface 101b of the first printed circuit board 101. The third electrical conductor 106 forms the negative output terminal (Vo−) of the voltage regulator module 1. Since the power module 2 of the present disclosure employs the third electrical conductor 106 as the negative output terminal (Vo−) of the voltage regulator module 1, the power module 2 can reduce the equivalent series resistance ESR and the equivalent series inductance ESL so that the dynamic switching performance of the voltage regulator module 1 is enhanced. Moreover, since the second electrical conductors 105 and the third electrical conductor 106 comprise good thermal conductivity respectively, the thermal resistance between the second electrical conductors 105 and the first printed circuit board 101 and the thermal resistance between the third electrical conductor 106 and the first printed circuit board 101 is reduced. Therefore, it is benefit to the power module 2 to conduct the heat to the case 13 of the electronic device. In this embodiment, the first electrical conductors 104, the second electrical conductors 105 and the third electrical conductors 106 are made of metallic material for example but not limited to copper, aluminum or alloy. In some embodiments, considering performance and cost, preferably but not exclusively, the first electrical conductors 104, the second electrical conductors 105 and the third electrical conductors 106 are made of copper. The shape of the electrical conductors isn't limited, which is designed according to the practical requirements.

Furthermore, in order to fix the first electrical conductors 104, the second electrical conductors 105 and the third electrical conductors 106 on the second surface 101b of the first printed circuit board 101 when reflowing, the four first electrical conductors 104 are stuck and glued with the magnetic core module 102, and the second electrical conductors 105 and the third electrical conductor 106 are glued at the edge of the magnetic core module 102.

In other embodiment, the first printed circuit board 101 comprises a plurality of through-holes 202 and a plurality of half-holes (not shown in FIGS. 2A and 2B). Each of the through-holes 202 run through the first printed circuit board 101, and the half-holes located at the second surface 101b do not run through the first printed circuit board 101. Besides, the power module 2 comprises a signal PIN combination 107 (i.e. a signal communication part) at one edge of the second surface 101b of the first printed circuit board 101. The signal PIN combination 107 comprises a plurality of pins. Each pin comprises a first contact part and a second contact part, which are opposite to each other. The first contact parts of some pins of the signal PIN combination 107 pass through the through-holes 202 of the first printed circuit board 101. The first contact parts of the other pins of the signal PIN combination 107 are plugged into the half-holes of the second surface 101b of the first printed circuit board 101 by soldering or be directly soldered on the second surface 101b of the first printed circuit board 101. Besides, the lengths of the pins of the signal PIN combination 107 can be different due to the different contacting methods. Since some of the pins of the signal PIN combination 107 are plugged into the half-holes of the second surface 101b of the first printed circuit board 101 or are directly soldered on the second surface 101b of the first printed circuit board 101 without passing through the through-holes 202 of the first printed circuit board 101, it can save the area of the first surface 101a of the first printed circuit board 101. Therefore, additional electronic elements can be settled on this saved area of the first surface 101a of the first printed circuit board 101 so as to increase the power density of the power module 2.

In some embodiments, the first surface 9a of the system board 9 comprises a plurality of soldering pads (not shown in FIGS. 2A and 2B). The first electrical conductors 104, the second electrical conductors 105, the third electrical conductor 106 and the pins of the signal PIN combination 107 can be soldered on the corresponding soldering pads, respectively.

Figure 5:
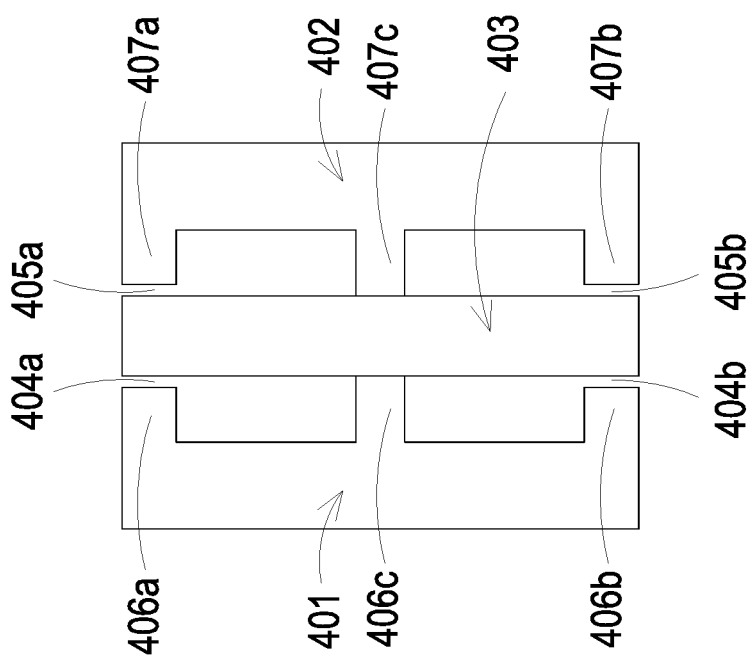
FIG. 5 is a cross-sectional view illustrating the magnetic core module of FIG. 2A according to a first embodiment of the present disclosure.

FIG. 5 is a cross-sectional view illustrating the magnetic core module of FIG. 2A according to a first embodiment of the present disclosure. As shown in FIG. 5, the magnetic core module 102 comprises two E cores 401, 402 and one I core 403. The I core 403 is disposed between the two E cores 401, 402 so that four holes 108 of the magnetic core module 102 are formed by the combination of the two E cores 401, 402 and the I core 403. Besides, a plurality of gaps 404a, 404b, 405a and 405b are formed and located at the intersections between the I core 403 and the two side columns of the two E cores 401, 402, wherein the E core 401 comprises two side columns 406a, 406b and a middle column 406c, and the E core 402 comprises two side columns 407a, 407b and a middle column 407c. Preferably, the magnetic core module 102 has a cross-sectional area in 田-shaped.

Figure 6:
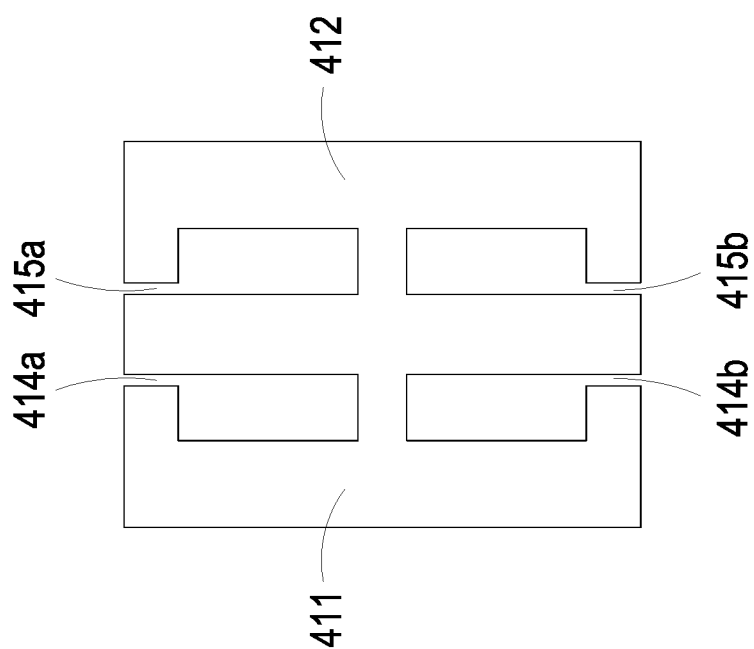
FIG. 6 is a cross-sectional view illustrating the magnetic core module according to a second embodiment of the present disclosure.

FIG. 6 is a cross-sectional view illustrating the magnetic core module according to a second embodiment of the present disclosure. As shown in FIG. 6, the magnetic core module 410 of the power module 2 of the present disclosure comprises single core integrated molding. In other words, the magnetic core module 410 can be an integrated structure in one piece. The magnetic core module 410 comprises a plurality of gaps 414a, 414b, 415a and 415b located at two side columns of the magnetic core module 410. Besides, the DC flux density Bdc at the middle column of the magnetic core module 410 counteracts, and there is no magnetic saturation at the middle column of the magnetic core module 410. Moreover, the sectional area of the middle column of the magnetic core module 410≤0.8×(the sectional area of one side column of the magnetic core module 410+the sectional area of the other side column of the magnetic core module 410). Preferably, the magnetic core module 410 has a cross-sectional area in 田-shaped.

In some embodiments, as shown in FIGS. 2A and 2B, the power module 2 comprises a second circuit board assembly 5. The second circuit board assembly 5 comprises a second printed circuit board 103 and at least one output capacitor Cout. The second printed circuit board 103 has a first surface 103a and a second surface 103b. The second printed circuit board 103 comprises a plurality of soldering pads (not shown in FIG. 2B) disposed on the first surface 103a and used to be soldered with the system board 9 so that the second printed circuit board 103 can be fixed on the system board 9 by soldering. Besides, the second printed circuit board 103 comprises a plurality of first soldering pads 204, a plurality of second soldering pads 205 and a third soldering pad 206 disposed on the second surface 103b of the second printed circuit board 103. A second terminal of each first electrical conductor 104 which forms the positive output terminal (Vo+) of the voltage regulator module 1 can be soldered on the corresponding first soldering pad 204. One terminal of the second electrical conductors 105 can be soldered on the corresponding second soldering pads 205. One terminal of the third electrical conductor 106 can be soldered on the corresponding third soldering pad 206. Furthermore, the second surface 103b of the second printed circuit board 103 comprises the half-hole combination 203 which comprises a plurality of half-holes. The second contact parts of the pins of the signal PIN combination 107 are plugged into the half-holes of the half-hole combination 203 of the second surface 103b of the second printed circuit board 103 by soldering. In other embodiment, the second contact parts of the pins of the signal PIN combination 107 can be soldered on the second surface 103b of the second printed circuit board 103 directly. Besides, the output capacitor Cout is disposed on the second surface 103b of the second printed circuit board 103. In other embodiment, the output capacitor Cout is disposed on the system board 9 when the second printed circuit board 103 is omitted.

Figure 7:
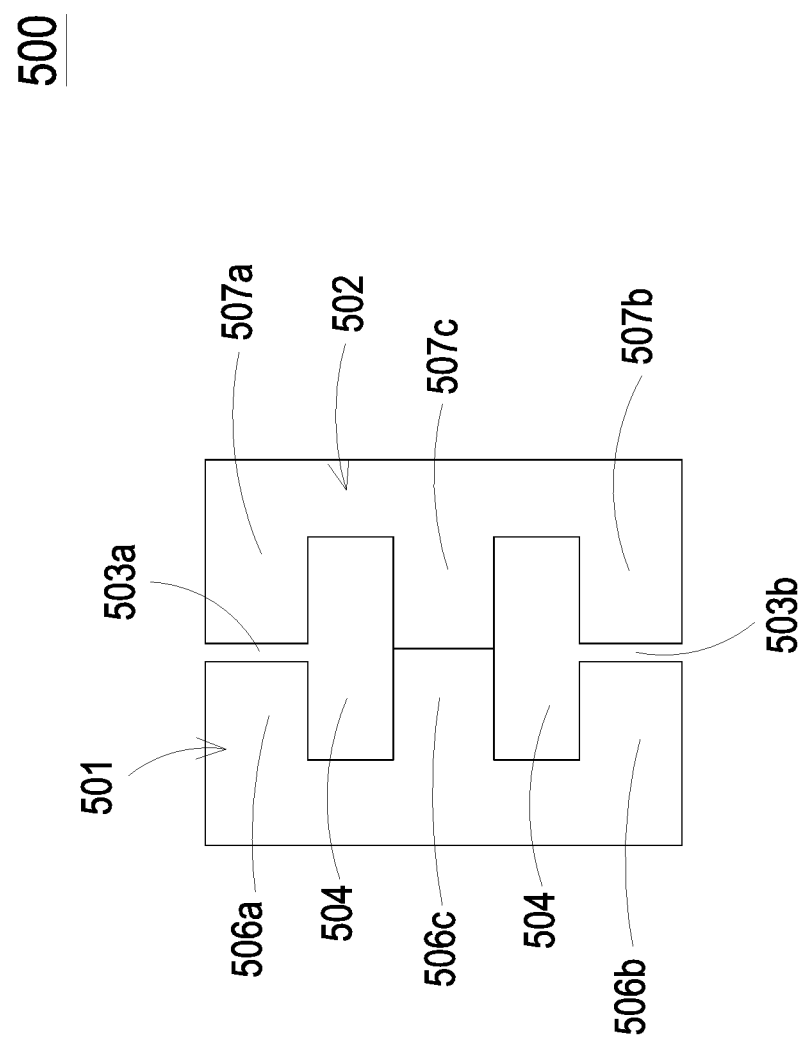
FIG. 7 is a cross-sectional view illustrating the magnetic core module according to a third embodiment of the present disclosure.

Furthermore, the voltage regulator module which is formed by the power module of the present disclosure also can be for example but not limited to a 2-phase buck converter or a 1-phase buck converter. When the voltage regulator module is a 2-phase buck converter, the voltage regulator module comprises two output inductors. Therefore, the differences between of the power module which forms 2-phase buck converter and the power module 2 which forms 4-phase buck converter shown in FIG. 2A are on the magnetic core module and the first electrical conductors. In this embodiment, the power module which forms 2-phase buck comprises two first electrical conductors. FIG. 7 is a cross-sectional view illustrating the magnetic core module according to a third embodiment of the present disclosure. When the power module forms 2-phase buck converter, the magnetic core module 500 of the power module includes two E cores 501, 502 so that two holes 504 of the magnetic core module 500 are formed by the combination of the two E cores 501, 502. The E core 501 comprises two side columns 506a and 506b and a middle column 506c, and the E core 502 comprises two side columns 507a and 507b and a middle column 506c. A gap 503a is formed and located between the side column 506a and the side column 507a. A gap 503b is formed and located between the side column 506b and the side column 507b. Moreover, the two first electrical conductors pass through the two holes 504 respectively to form the two output inductors.

Figure 8:
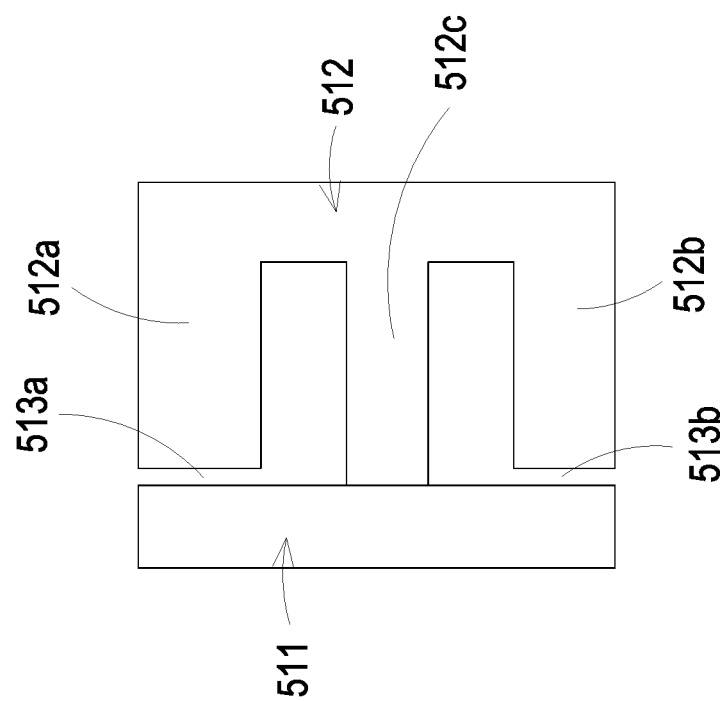
FIG. 8 is a cross-sectional view illustrating the magnetic core module according to a fourth embodiment of the present disclosure.

FIG. 8 is a cross-sectional view illustrating the magnetic core according to a fourth embodiment of the present disclosure. In some embodiments, when the power module forms 2-phase buck converter, the magnetic core module 510 of the power module may include one E core 512 and one I core 511. A gap 513a is formed and located between one side column 512a of the E core 512 and the I core 511. A gap 513b is formed and located between the other side column 512b of the E core 512 and the I core 511. Besides, the DC flue density Bdc at the middle column 512c of the magnetic core module 510 counteracts, and there is no magnetic saturation at the middle column 512c of the magnetic core module 510. Moreover, the sectional area of the middle column 512c of the magnetic core module 510≤0.8×(the sectional area of one side column 512a of the magnetic core module 510+the sectional area of the other side column 512b of the magnetic core module 510). In other embodiments, the magnetic core module 510 may be integrated molding. In other words, the magnetic core module 510 can be an integrated structure in one piece.

Figure 9:
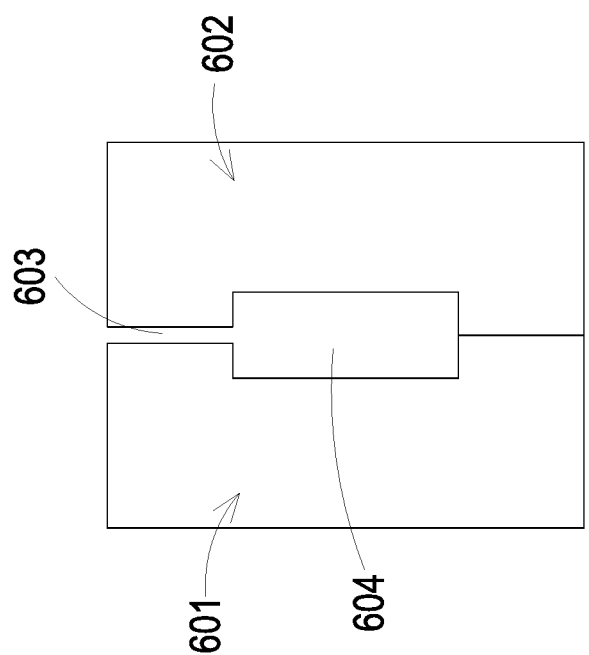
FIG. 9 is a cross-sectional view illustrating the magnetic core module according to a fifth embodiment of the present disclosure.

When the voltage regulator module is a 1-phase buck converter, the voltage regulator module comprises one output inductor. Therefore, the differences between of the power module which forms 1-phase buck converter and the power module 2 which forms 4-phase buck converter shown in FIG. 2A are on the magnetic core module and the first electrical conductors. In this embodiment, the power module which forms 1-phase buck comprises one first electrical conductor. FIG. 9 is a cross-sectional view illustrating the magnetic core according to a fifth embodiment of the present disclosure. When the power module forms 1-phase buck converter, the magnetic core module 600 of the power module includes two U cores 601, 602 so that one hole 604 of the magnetic core module 600 is formed by the combination of the two U cores 601, 602. A gap 603 is formed and located between one side column of the U core 601 and one side column of the U core 602. Moreover, the one first electrical conductor passes through the hole 604 to form the output inductor. In other embodiment, the magnetic core module 600 may be formed by one U core and one I core. Besides, the magnetic core module 600 can be integrated molding. In other words, the magnetic core 600 can be an integrated structure in one piece.

Figure 10:
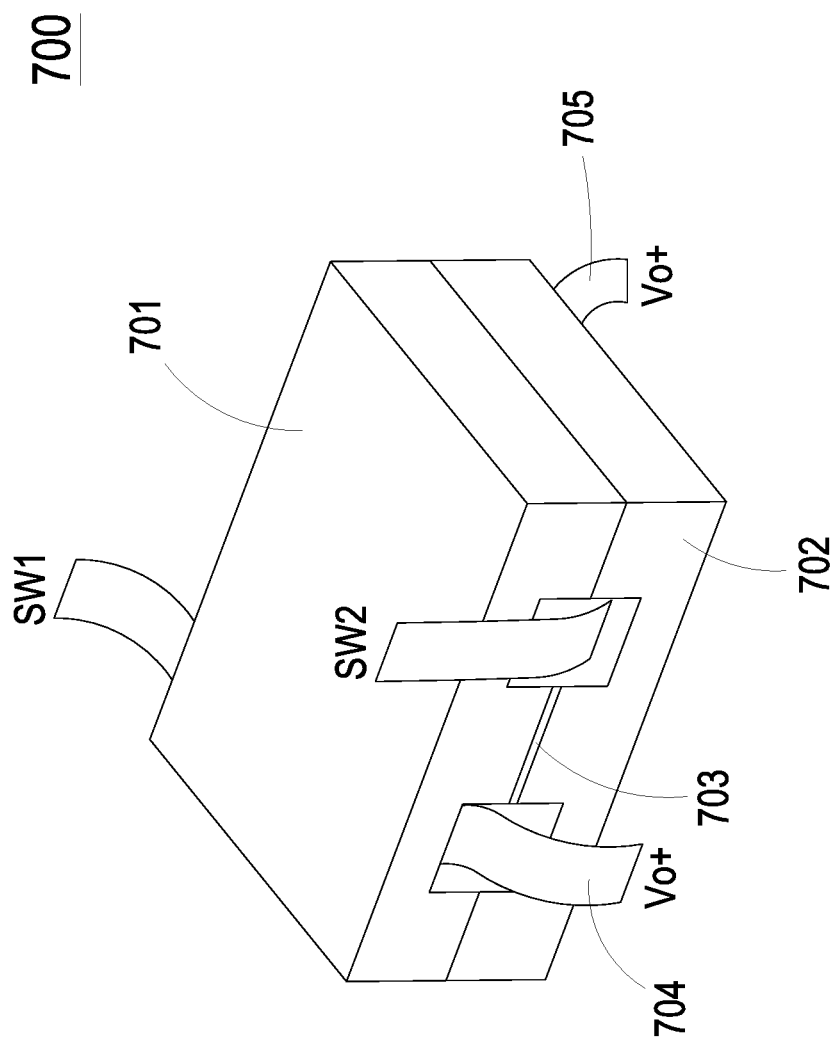
FIG. 10 is a schematic assembled view illustrating the magnetic core module of the power module assembled with the first electrical conductors of the power module when the power module forms a 2-phase buck converter.

Furthermore, the output inductors can also be coupled together to reduce the ripple of the output current of voltage regulator module. For example, when the voltage regulator module is the 4-phase buck converter, the four output inductors are coupled together. When the voltage regulator module is the 2-phase buck converter, the two output inductors are coupled together. The following will exemplarily illustrate the structures of the magnetic core module and the first electrical conductors of the power module when the power module is the 2-phase buck converter and the output inductors of the 2-phase buck converter are coupled together. FIG. 10 is a schematic assembled view illustrating the magnetic core module of the power module assembled with the first electrical conductors of the power module when the power module forms a 2-phase buck converter. The magnetic core module 700 of the power module comprises two E cores 701 and 702. The gap 703 is formed and located at a middle column of the magnetic core 700. Besides, the two first electrical conductors 704 and 705 can be formed by two copper bars which are flexible. The combination of the magnetic core module 700 and two first electrical conductors 704, 705 can form two coupled output inductors. One terminal (SW1/SW2) of the two electrical conductors 704 and 705 are fixed on the first printed circuit board of the power module by soldering. The other terminal (Vo+) of the two electrical conductors 704 and 705 are connected to the second printed circuit board or the system board. In the magnetic core module 700, there is a gap 703 formed at the middle column of the magnetic core module 700, and the DC flux density Bdc at the middle column of the magnetic core 700 overlays, and the AC flex density Bac at the middle column of the magnetic core 700 counteracts.

Obviously, the power module using 4-phase buck converter also can use the coupled output inductors based on the same principle shown in FIG. 10.

From the above descriptions, the present disclosure provides a power module. Since the power module of the present disclosure employs the first electrical conductors as the windings of the output inductors, the power loss of the output inductors can be reduced. In addition, since the first electrical conductors have good thermal conductivity and shorter length, the thermal resistance between the thermal sources and the case of the electronic device is reduced by the first electrical conductors. Therefore, it is benefit to the power module to conduct the heat to the case of the electronic device. At the same time, suitable inductance can be obtained according to the length of the first electrical conductors and the cross-sectional area of the magnetic core. Moreover, since some of the pins of the signal PIN combination are plugged into the half-holes of the second surface of the first printed circuit board or are directly soldered on the second surface of the first printed circuit board without passing through the through-holes of the first printed circuit board, it can save the area of the first surface of the first printed circuit board. Therefore, additional electronic elements can be settled on this saved area of the first surface of the first printed circuit board so as to increase the power density of the power module.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
   a first circuit board assembly comprising a first printed circuit board and at least one power circuit;
   a second circuit board assembly comprising a second printed circuit board and at least one output capacitor; and
   a magnetic assembly located between the first circuit board assembly and the second circuit board assembly and comprising:
      a magnetic core module comprising at least one hole; and
      at least one first electrical conductor, wherein the at least one first electrical conductor passes through the corresponding hole of the magnetic core module to define at least one output inductor;
   wherein each of the at least one output inductor is electrically connected with the corresponding power circuit and the at least one output capacitor so that the power module forms at least one phase converter.

2. The power module according to claim 1, wherein the power module is disposed in an electronic device, and the at least one power circuit is in contact with a case of the electronic device.

3. The power module according to claim 1, wherein the first printed circuit board comprises a first surface and a second surface, wherein the at least one power circuit is disposed on the first surface of the first printed circuit board, one end of the at least one first electrical conductor is disposed on the second surface of the first printed circuit board and electrically connected with the at least one power circuit.

4. The power module according to claim 3, wherein the second printed circuit board comprises a first surface and a second surface, the at least one output capacitor is disposed on the second surface of the second printed circuit board, and the second printed circuit board comprises a plurality of first soldering pads, a plurality of second soldering pads and a third soldering pad disposed on the second surface thereof, wherein the other end of the at least one first electrical conductor is disposed on and electrically connected with the corresponding first soldering pad.

5. The power module according to claim 4, further comprising a plurality of second electrical conductors, wherein one end of the second electrical conductors is disposed on one edge of the second surface of the first printed circuit board and electrically connected with the at least one power circuit, the other end of the second electrical conductors is disposed on and electrically connected with the corresponding second soldering pads, wherein at least one of the plurality of second electrical conductors forms a positive input terminal of the power module.

6. The power module according to claim 4, further comprising a third electrical conductor, wherein one end of the third electrical conductor is disposed on the other edge of the second surface of the first printed circuit board and electrically connected with the at least one power circuit, the other end of the third electrical conductor is disposed on and electrically connected with the corresponding third soldering pad, wherein the third electrical conductor forms a negative output terminal of the power module.

7. The power module according to claim 4, wherein the at least one first electrical conductor is stuck and glued with the magnetic core module, and the second electrical conductors and the third electrical conductor are glued at one edge of the magnetic core module.

8. The power module according to claim 3, wherein the first printed circuit board comprises a plurality of half-holes disposed in the second surface and a plurality of through-holes, wherein the power module comprises a signal pin combination with a plurality of pins, wherein the signal pin combination is located at one edge of the second surface of the first printed circuit board, and each of the plurality of pins comprises a first contact part and a second contact part, wherein the first contact parts of some of the pins of the signal pin combination pass through the through-holes of the first printed circuit board, and the first contact parts of the other pins of the signal pin combination are plugged into the half-holes of the second surface of the first printed circuit board by soldering.

9. The power module according to claim 8, wherein the second surface of the second printed circuit board comprises a half-hole combination with a plurality of half-holes, wherein the second contact parts of the pins of the signal pin combination are plugged into the half-holes of the half-hole combination of the second surface of the second printed circuit board.

10. The power module according to claim 1, wherein the magnetic core module comprises two E cores and one I core, wherein the I core is disposed between two E cores so that the four holes of the magnetic core module are formed by the combination of the two E cores and the I core.

11. The power module according to claim 10, wherein the magnetic core module comprises a plurality of gaps formed and located at the intersections between the I core and two side columns of the two E cores.

12. The power module according to claim 11, wherein the two E cores and the I core are integrated with each other.

13. The power module according to claim 12, wherein a sectional area of a middle column of the magnetic core module≤0.8×(a sectional area of one of the side columns of the magnetic core module+a sectional area of the other of the side columns of the magnetic core module).

14. The power module according to claim 1, wherein the magnetic core module comprises two E cores so that the two holes of the magnetic core module are formed by the combination of the two E cores.

15. The power module according to claim 14, wherein the magnetic core module comprises two gaps, wherein each of the two gaps is formed and located between two corresponding side columns of the two E cores.

16. The power module according to claim 1, wherein the magnetic core module comprises one E core, one I core and two gaps, wherein each of the two gaps is formed and located between corresponding one of two side columns of the E core and the I core, respectively.

17. The power module according to claim 16, wherein a sectional area of middle column of the magnetic core module≤0.8×(a sectional area of one of the two side columns of the magnetic core module+a sectional area of the other of the two side columns of the magnetic core module).

18. The power module according to claim 1, wherein the magnetic core module comprises two U cores so that the one hole of the magnetic core module is formed by the combination of the two U cores.

19. The power module according to claim 1, wherein the at least one output inductor comprises a plurality of output inductors, and all of the plurality of output inductors are coupled together.

20. The power module according to claim 1, wherein the second circuit board assembly is a system board.

* * * * *